United States Patent
Choi et al.

(10) Patent No.: US 12,295,219 B2
(45) Date of Patent: May 6, 2025

(54) ORGANIC LIGHT-EMITTING DISPLAY DEVICE

(71) Applicant: Samsung Display Co., Ltd., Yongin-Si (KR)

(72) Inventors: Yoonsun Choi, Hwaseong-si (KR); Seong Ryong Lee, Hwaseong-si (KR); Hyun Chul Kim, Hwaseong-si (KR); Seongjun Lee, Seoul (KR); Eunae Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/377,255

(22) Filed: Apr. 8, 2019

(65) Prior Publication Data
US 2019/0341439 A1    Nov. 7, 2019

(51) Int. Cl.
*H10K 59/131*    (2023.01)
*G09G 3/20*    (2006.01)
(Continued)

(52) U.S. Cl.
CPC ......... *H10K 59/131* (2023.02); *G09G 3/3291* (2013.01); *H10K 50/8445* (2023.02);
(Continued)

(58) Field of Classification Search
CPC .... H01L 27/323–3276; H01L 51/5256; G09G 3/3291
See application file for complete search history.

(56) References Cited

U.S. PATENT DOCUMENTS

| | | |
|---|---|---|
| 8,829,495 B2 | 9/2014 | Kim et al. |
| 9,231,000 B2 | 1/2016 | Ko et al. |

(Continued)

FOREIGN PATENT DOCUMENTS

| | | |
|---|---|---|
| EP | 3217265 A1 | 9/2017 |
| EP | 3226300 A1 | 10/2017 |

(Continued)

OTHER PUBLICATIONS

Extended European Search Report, Application No. 19172484.8, dated Sep. 9, 2019, 9 pages.

(Continued)

*Primary Examiner* — Lin Li
(74) *Attorney, Agent, or Firm* — Innovation Counsel LLP

(57) ABSTRACT

An organic light-emitting display device includes a base substrate, a pixel array, a first power voltage wiring and a second power voltage wiring. The base substrate includes a pixel area and a peripheral area. The pixel array is disposed in the pixel area. The first power voltage wiring is disposed in the peripheral area and includes a first lower power voltage line and a first upper power voltage line. The first upper power voltage line is disposed on and contacts the first lower power voltage line. The second power voltage wiring is disposed in the peripheral area and includes a second lower power voltage line and a second upper power voltage line. The second upper power voltage line is disposed on and contacts the second lower power voltage line. The first upper power voltage line overlaps the second lower power voltage line in a plan view.

16 Claims, 13 Drawing Sheets

(51) Int. Cl.
  *G09G 3/3233* (2016.01)
  *G09G 3/3291* (2016.01)
  *G09G 3/36* (2006.01)
  *H10K 50/844* (2023.01)
  *H10K 59/122* (2023.01)
  *H10K 59/40* (2023.01)
  *H10K 71/00* (2023.01)

(52) U.S. Cl.
  CPC .......... *H10K 59/122* (2023.02); *H10K 59/40* (2023.02); *G09G 2300/0426* (2013.01); *G09G 2300/0439* (2013.01)

(56) References Cited

U.S. PATENT DOCUMENTS

| | | | | |
|---|---|---|---|---|
| 9,245,939 | B2* | 1/2016 | Ono | H01L 51/5228 |
| 9,893,139 | B2 | 2/2018 | Kim et al. | |
| 9,954,200 | B2* | 4/2018 | Kim | H10K 59/131 |
| 2007/0045626 | A1* | 3/2007 | Murade | G02F 1/13458 |
| | | | | 257/E27.131 |
| 2008/0225216 | A1* | 9/2008 | Shimodaira | G02F 1/1362 |
| | | | | 349/143 |
| 2011/0057920 | A1* | 3/2011 | Matsuura | H10K 50/14 |
| | | | | 345/76 |
| 2011/0227098 | A1* | 9/2011 | Choi | H10K 59/131 |
| | | | | 257/E51.018 |
| 2014/0131683 | A1 | 5/2014 | Kim et al. | |
| 2014/0176399 | A1* | 6/2014 | Lee | G09G 3/20 |
| | | | | 345/55 |
| 2014/0228927 | A1* | 8/2014 | Ahmad | A61H 39/002 |
| | | | | 607/148 |
| 2014/0232007 | A1* | 8/2014 | Kasai | H01L 23/60 |
| | | | | 257/773 |
| 2014/0239270 | A1 | 8/2014 | Ko et al. | |
| 2014/0239823 | A1* | 8/2014 | Ahn | G09G 3/3233 |
| | | | | 315/161 |
| 2014/0332765 | A1* | 11/2014 | Kim | H10K 59/131 |
| | | | | 438/23 |
| 2015/0187862 | A1* | 7/2015 | Kim | H10K 71/00 |
| | | | | 438/23 |
| 2015/0228927 | A1* | 8/2015 | Kim | H10K 50/805 |
| | | | | 257/40 |
| 2017/0117346 | A1* | 4/2017 | Kim | H01L 23/49555 |
| 2017/0162599 | A1* | 6/2017 | Koide | G02F 1/13338 |
| 2017/0278469 | A1* | 9/2017 | Iwami | G09G 3/3611 |
| 2017/0288008 | A1* | 10/2017 | Kim | H10K 59/1315 |
| 2017/0294502 | A1* | 10/2017 | Ka | H10K 59/131 |
| 2017/0351365 | A1 | 12/2017 | Sasaki et al. | |
| 2017/0365808 | A1 | 12/2017 | Lee et al. | |
| 2017/0373132 | A1* | 12/2017 | Choung | H10K 59/1315 |
| 2019/0036065 | A1 | 1/2019 | Lee et al. | |

FOREIGN PATENT DOCUMENTS

| | | | |
|---|---|---|---|
| EP | 3229287 A1 | 10/2017 | |
| EP | 3255674 A1 | 12/2017 | |
| EP | 3258496 A1 | 12/2017 | |
| KR | 20060059745 A * | 11/2004 | ............ H05B 33/26 |
| KR | 10-2006-0059745 A | 6/2006 | |
| KR | 10-2011-0132819 A | 12/2011 | |
| KR | 10-2014-0060152 A | 5/2014 | |
| KR | 10-2014-0108023 A | 9/2014 | |
| KR | 10-2016-0083588 A | 7/2016 | |
| KR | 10-2017-0114027 A | 10/2017 | |
| KR | 10-2017-0126556 A | 11/2017 | |
| KR | 10-2017-0142233 A | 12/2017 | |
| WO | 2016032175 A1 | 3/2016 | |

OTHER PUBLICATIONS

Korean Notice of Allowance corresponding to Application No. 10-2018-0052158 and issued on Apr. 8, 2024, 7 pages.

\* cited by examiner

ORGANIC LIGHT-EMITTING DISPLAY DEVICE

CROSS-REFERENCE TO RELATED APPLICATION

This application claims priority to and the benefit of Korean Patent Application No. 10-2018-0052158 filed on May 4, 2018 in the Korean Intellectual Property Office, the entire disclosure of which is incorporated by reference herein in its entirety.

BACKGROUND

1. Field

Exemplary embodiments of the present disclosure relate to a display device, more particularly, to an organic light-emitting display device.

2. Description of the Related Art

A flat panel display device has substituted a conventional display device such as a cathode-ray tube display device for its lightweight and relatively thinness. Examples of the flat panel display device include a liquid crystal display (LCD) device and an organic light-emitting display device.

Recently, a flexible organic light-emitting display device has been researched and developed. The flexible organic light-emitting display device is capable of being bent or folded at least at a portion thereof. For example, the flexible organic light-emitting display device may include a flexible base substrate, a pixel array disposed on the base substrate, and a thin film encapsulation layer covering the pixel array. The flexible organic light-emitting display device may increase visibility and reduce an area size of a non-display area by bending or folding a portion thereof.

SUMMARY

Exemplary embodiments of the present disclosure provide an organic light-emitting display device.

According to an exemplary embodiment, an organic light-emitting display device includes a base substrate, a pixel array, a first power voltage wiring and a second power voltage wiring. The base substrate includes a pixel area and a peripheral area that surrounds the pixel area. The pixel array is disposed in the pixel area. The first power voltage wiring is disposed in the peripheral area and includes a first lower power voltage line and a first upper power voltage line. The first upper power voltage line is disposed on the first lower power voltage line and contacts the first lower power voltage line. The second power voltage wiring is disposed in the peripheral area and includes a second lower power voltage line and a second upper power voltage line. The second upper power voltage line is disposed on the second lower power voltage line and contacts the second lower power voltage line. The first upper power voltage line overlaps the second lower power voltage line in a plan view.

In an exemplary embodiment, the second power voltage wiring is disposed between the first power voltage wiring and the pixel area.

In an exemplary embodiment, the first lower power voltage line is spaced apart from the second lower power voltage line, and the first upper power voltage line is spaced apart from the second upper power voltage line.

In an exemplary embodiment, a width of the first upper power voltage line is greater than a width of the first lower power voltage line, and a width of the second upper power voltage line is smaller than a width of the second lower power voltage line.

In an exemplary embodiment, the first upper power voltage line covers a gap between the first lower power voltage line and the second lower power voltage line in a plan view.

In an exemplary embodiment, the pixel array includes an organic light-emitting diode that includes a first electrode and a second electrode. The second electrode of the organic light-emitting diode extends from the pixel area to the peripheral area and contacts the first upper power voltage line.

In an exemplary embodiment, the organic light-emitting display device further includes a fan-out wiring overlapping the first power voltage wiring and the second power voltage wiring.

In an exemplary embodiment, the fan-out wiring is disposed under the first power voltage wiring and the second power voltage wiring.

In an exemplary embodiment, the fan-out wiring includes a plurality of lines spaced apart from each other. At least a portion of the fan-out wiring overlaps a gap between the first lower power voltage line and the second lower power voltage line in a plan view.

In an exemplary embodiment, the organic light-emitting display device further includes a touch screen structure disposed in the pixel area and the peripheral area to overlap the fan-out wiring.

In an exemplary embodiment, the fan-out wiring is configured to transfer a data signal to the pixel array.

In an exemplary embodiment, the organic light-emitting display device further includes a first via insulation layer partially covering the first lower power voltage line and the second lower power voltage line.

In an exemplary embodiment, the first via insulation layer includes one or more contact holes. The first upper power voltage line is connected to the first lower power voltage line through the one or more contact holes of the first via insulation layer.

In an exemplary embodiment, the first via insulation layer includes one or more contact holes. The second upper power voltage line is connected to the second lower power voltage line through the one or more contact holes of the first via insulation layer.

In an exemplary embodiment, the organic light-emitting display device further includes a thin film encapsulation layer covering the pixel array and extending to the peripheral area.

In an exemplary embodiment, the thin film encapsulation layer includes at least one organic layer and at least one inorganic layer.

In an exemplary embodiment, the organic light-emitting display device further includes at least one dam structure disposed in the peripheral area In an exemplary embodiment, the organic light-emitting display device further includes at least one valley structure disposed between the at least one dam structure and the pixel area.

In an exemplary embodiment, the pixel array includes an organic light-emitting diode that includes a first electrode and a second electrode. The second electrode of the organic light-emitting diode is disposed in the pixel area and the peripheral area, extends along a side surface and an upper surface of the at least one valley structure in the peripheral area, and contacts the first upper power voltage line.

In an exemplary embodiment, the at least one valley structure is disposed on the first upper power voltage line and is connected to a first via insulation layer that is disposed under the first upper power voltage line through a contact hole of the first upper power voltage line.

According to exemplary embodiments, a first power voltage wiring and a second power voltage wiring that are disposed in a peripheral area include a plurality of lines that are formed in different layers and disposed on different planes, respectively. Thus, the first power voltage wiring and the second power voltage wiring may have a reduced width compared to a single-layered structure in view of conductivity. Thus, a size of the peripheral area may be reduced, and a size of a non-display area in the organic light-emitting display device may be reduced.

In an exemplary embodiment, the first upper power voltage line expands toward the pixel area, and the second lower power voltage line expands toward the first power voltage wiring thereby forming an asymmetrical structure. Thus, a boundary of the second electrode of the organic light-emitting diode may be shifted toward the pixel area, Accordingly, a size of the second electrode in the peripheral area may be reduced, and a size of the non-display area in the organic light-emitting display device may be reduced.

In an exemplary embodiment, the first upper power voltage line may cover a gap between the first lower power voltage line and the second lower power voltage line in a plan view. Thus, a noise generated by interference between the fan-out wiring and the touch screen structure may be reduced or prevented.

BRIEF DESCRIPTION OF THE DRAWINGS

Aspects of one or more exemplary embodiments of the present inventive concept will be more clearly understood from the following detailed description taken in conjunction with the accompanying drawings.

DETAILED DESCRIPTION

Figure 1:
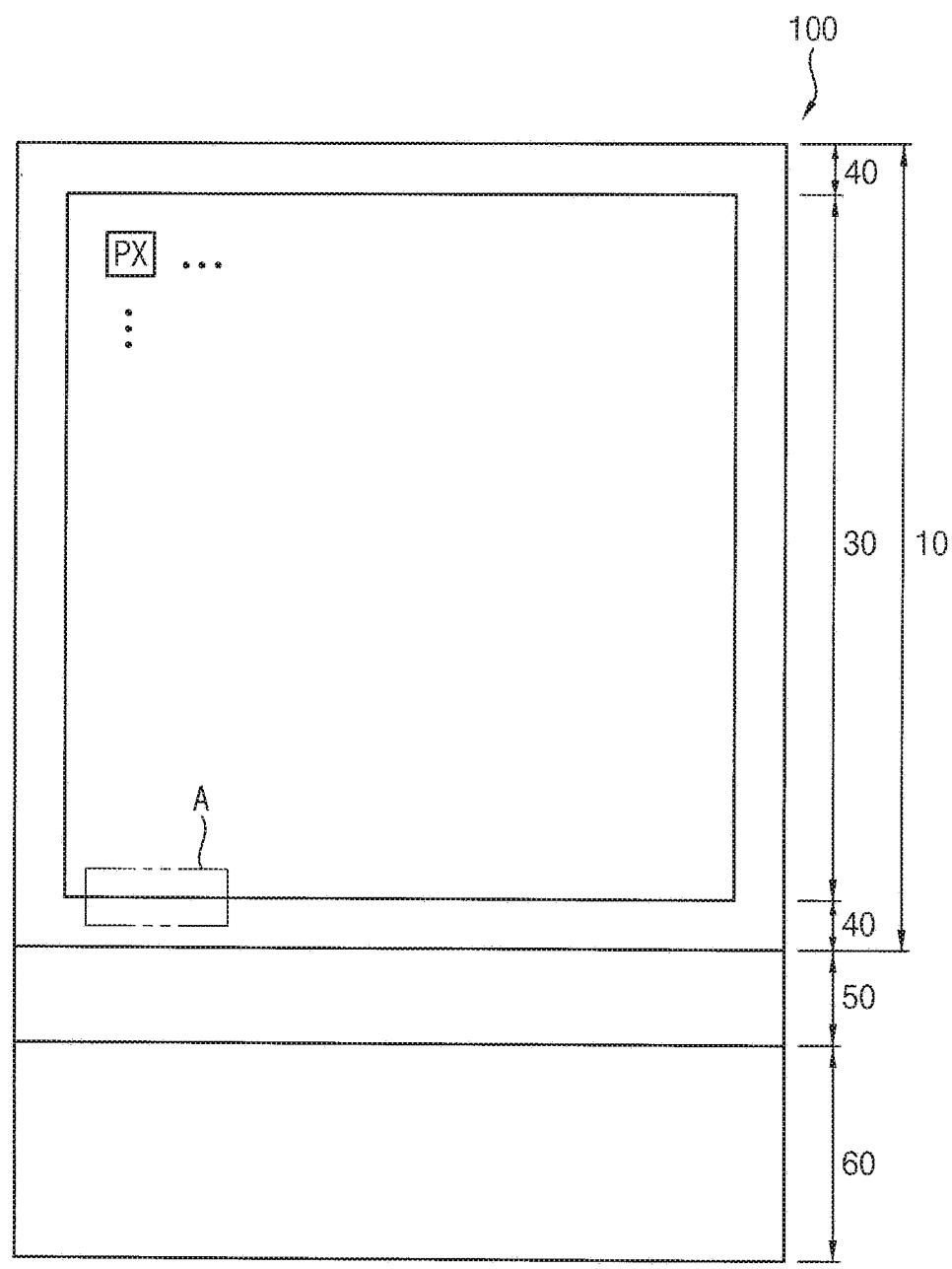
FIG. 1 is a plan view illustrating an organic light-emitting display device according to an exemplary embodiment.

An organic light-emitting display device and a method of manufacturing the organic light-emitting display device according to exemplary embodiments of the present inventive concept will be described hereinafter with reference to the accompanying drawings, in which some exemplary embodiments are shown. Same or similar reference numerals may be used for same or similar elements in the drawings.

Figure 2:
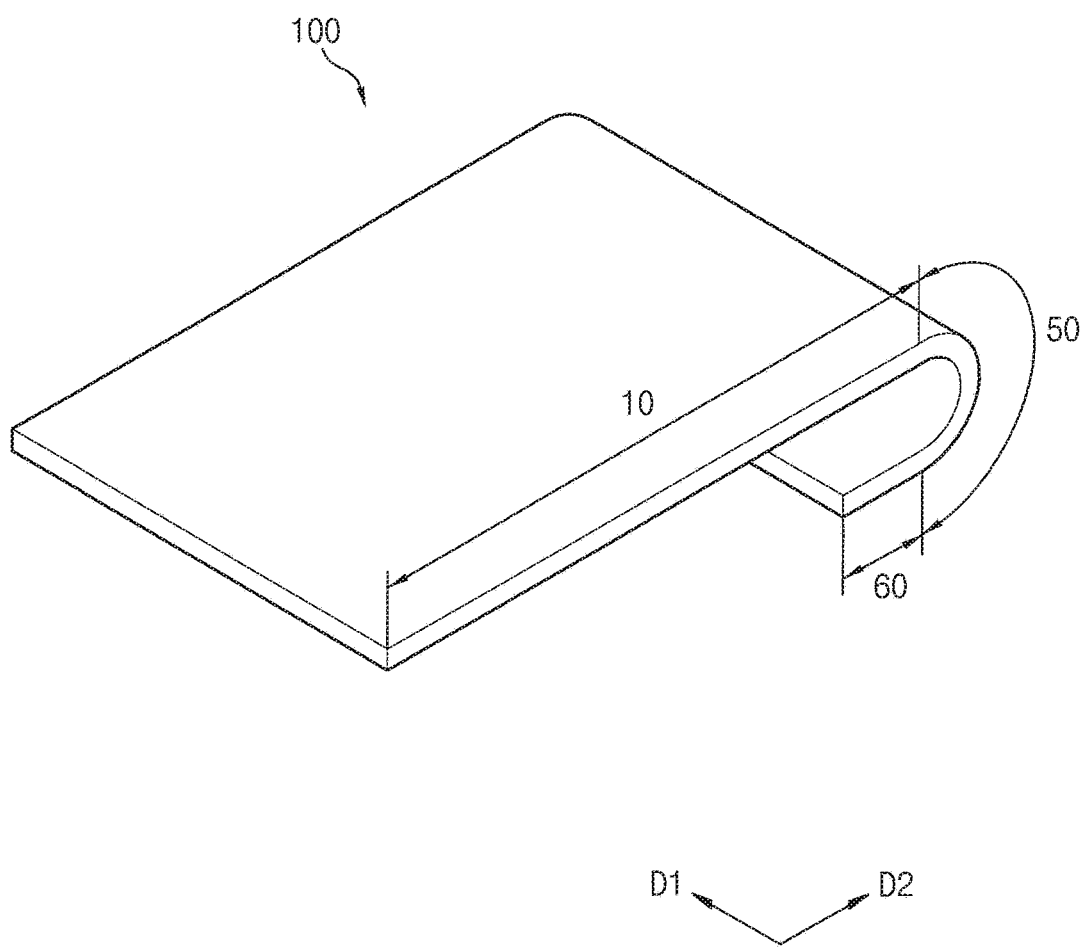
FIG. 2 is a perspective view illustrating a bent shape of the organic light-emitting display device illustrated in FIG. 1.

FIG. 1 is a plan view illustrating an organic light-emitting display device 100 according to an exemplary embodiment. FIG. 2 is a perspective view illustrating a bent shape of the organic light-emitting display device 100 illustrated in FIG. 1.

Referring to FIGS. 1 and 2, the organic light-emitting display device 100 may include a display area 10, a bending area 50, and a signal-providing area 60. The display area 10 may include a pixel area 30 and a peripheral area 40 that surrounds the pixel area 30. A pixel array including a plurality of pixels PX may be disposed in the pixel area 30. The display area 10 may correspond to a front portion of the organic light-emitting display device 100.

A plurality of pad electrodes that are electrically connected to an external device may be disposed in the signal-providing area 60. For example, an external device such as a driving chip may be mounted in the signal-providing area 60, or the pad electrodes may be connected to an external device through a flexible printed circuit board.

The pixel array may generate a light based on electrical signals provided by the external device to display an image in the display area 10.

The bending area 50 may be disposed between the display area 10 and the signal-providing area 60. The display area 10, the bending area 50, and the signal-providing area 60 may be arranged sequentially. Connection wirings may be disposed in the bending area 50 to transfer the electrical signals from the signal-providing area 60 to the peripheral area 40.

A plurality of signal wirings may be disposed in the peripheral area 40 to transfer the electrical signals to the pixel area 30. For example, the signal wirings may transfer a data signal, a scan signal, a light-emitting signal, a power voltage signal, a touch-sensing signal, or the like. Furthermore, a scan driver, a data driver, or the like may be disposed in the peripheral area 40.

Referring to FIG. 1, a width of the peripheral area 40 that surrounds the pixel area 30 may be uniform. That is, the width of the peripheral area 40 is the same along the perimeter of the organic light-emitting display device 100. However, exemplary embodiments are not limited thereto, and the peripheral area 40 may have various configurations, shapes, and sizes according to a desired design of the organic light-emitting display device 100.

Referring to FIG. 2, the bending area 50 may bend with respect an axis along a first direction D1 so that the signal-providing area 60 may be disposed under the display area 10 to overlap at least a portion of the display area 10. Thus, the bending area 50 may have a bent shape after the bending area 50 is bent.

Figure 3:
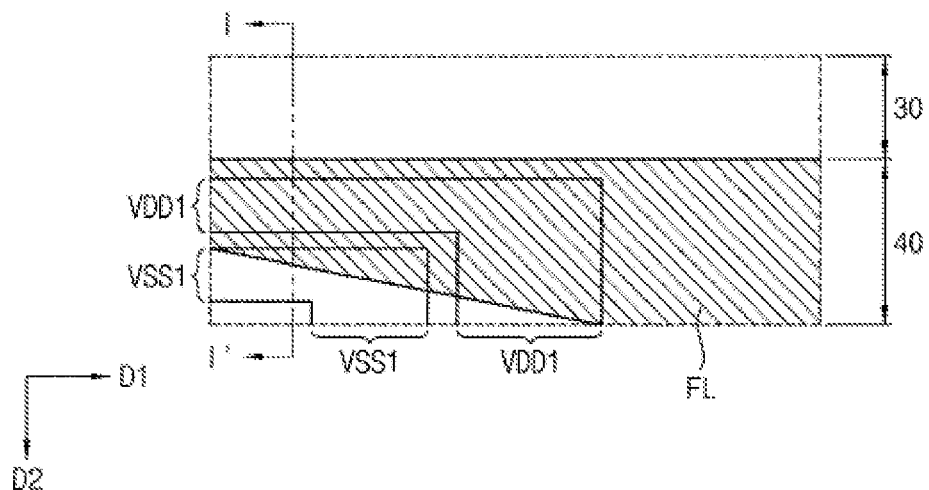
FIGS. 3 and 4 are enlarged plan views illustrating the region 'A' of FIG. 1.
Figure 4:
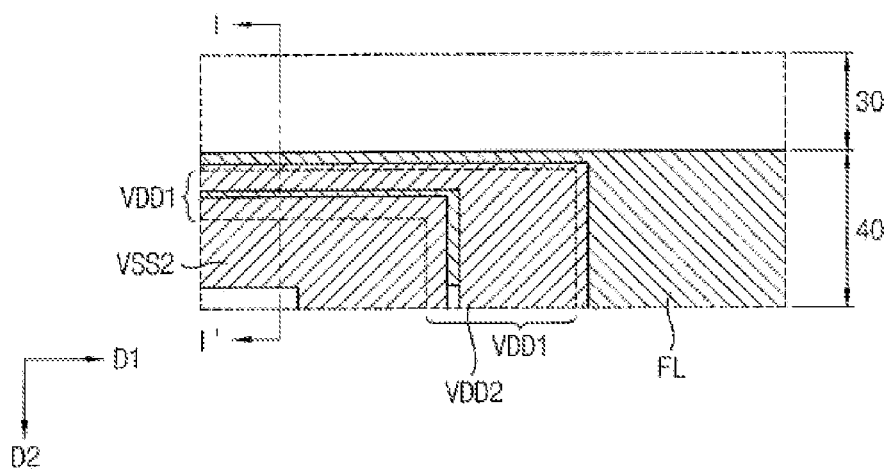

FIGS. 3 and 4 are enlarged plan views illustrating the region 'A' of FIG. 1. Particularly, FIG. 3 shows a first lower power voltage line VSS1, a second lower power voltage line VDD1, and a fan-out wiring FL that are disposed in the peripheral area 40. FIG. 4 shows a first upper power voltage line VSS2, the second lower power voltage line VDD1, and the fan-out wiring FL.

Referring to FIG. 3, the first lower power voltage line VSS1, the second lower power voltage line VDD1, and the fan-out wiring FL may be disposed in the peripheral area 40. The first lower power voltage line VSS1 and the second lower power voltage line VDD1 may be formed in the same layer. Thus, the first lower power voltage line VSS1 and the second lower power voltage line VDD1 may be spaced apart from each other. In an exemplary embodiment, the first lower power voltage line VSS1 may substantially extend in the first direction D1 along the peripheral area 40. The second lower power voltage line VDD1 may be disposed between the first lower power voltage line VSS1 and the pixel area 30. The second lower power voltage line VDD1 may substantially extend in the same direction as the first lower power voltage line VSS1.

The fan-out wiring FL may be disposed in a different layer from the first lower power voltage line VSS1 and the second lower power voltage line VDD1. In an exemplary embodiment, the fan-out wiring FL may be disposed below the first lower power voltage line VSS1 and the second lower power voltage line VDD1 overlapping at least a portion of the first lower power voltage line VSS1 and the second lower power voltage line VDD1. The fan-out wiring FL may be electrically connected to the pixel array in the pixel area 30 to provide electrical signals to the pixels PX in the pixel area 30. For example, the fan-out wiring FL may transfer a data signal to the pixel array in the pixel area 30.

Referring to FIG. 4, the first upper power voltage line VSS2 is disposed on the first lower power voltage line VSS1. The first upper power voltage line VSS2 contacts and is electrically connected to the first lower power voltage line VSS1. Furthermore, the first upper power voltage line VSS2 may expand toward the pixel area 30 from the first lower power voltage line VSS1 to overlap a portion of the second lower power voltage line VDD1. Thus, the first upper power voltage line VSS2 may have a shape covering a gap between the first lower power voltage line VSS1 and the second lower power voltage line VDD1 in a plan view.

Although not illustrated in FIG. 3, a second upper power voltage line VDD2 may be disposed on the second lower power voltage line VDD1. The second upper power voltage line VDD2 contacts and is electrically connected to the second lower power voltage line VDD1. The second upper power voltage line VDD2 may be formed in the same layer as the first upper power voltage line VSS2. Thus, the second upper power voltage line VDD2 and the first upper power voltage line VSS2 may be spaced apart from each other. The above-described structure including the second upper power voltage line VDD2 will be more fully described in the following.

Figure 5:
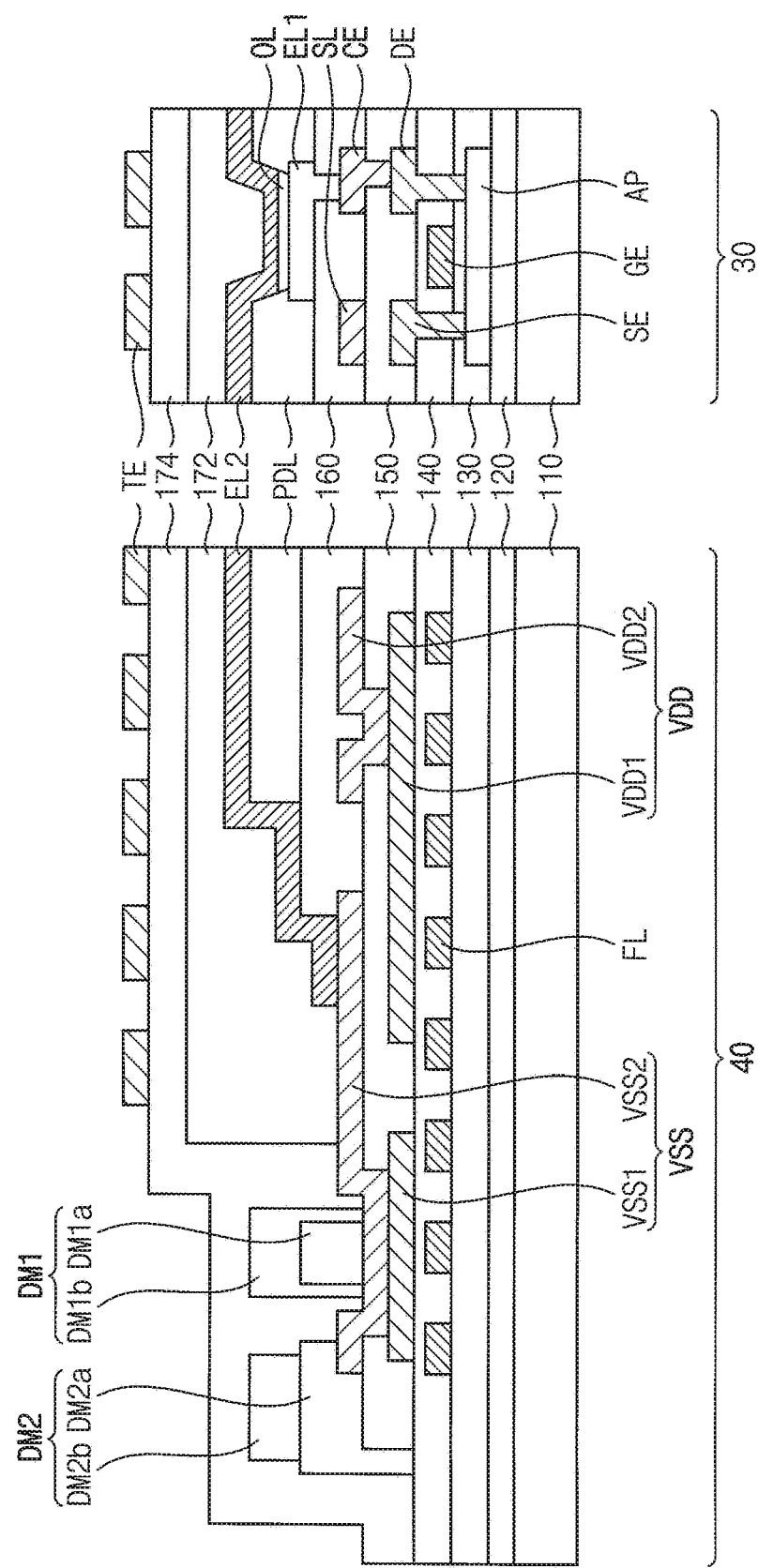
FIG. 5 is a cross-sectional view taken along the line I-I' of FIGS. 3 and 4.

FIG. 5 is a cross-sectional view taken along the line I-I' of FIGS. 3 and 4.

Referring to FIG. 5, a pixel PX disposed in the pixel area 30 may include a driving transistor disposed on a base substrate 110, an organic light-emitting diode (OLED) that is electrically connected to the driving transistor, and a thin film encapsulation layer that covers the organic light-emitting diode. The driving transistor may include an active pattern AP, a gate electrode GE that overlaps the active pattern AP, a source electrode SE that is electrically connected to the active pattern AP, and a drain electrode DE that is electrically connected to the active pattern AP and spaced apart from the source electrode SE.

The base substrate 110 may include glass, quartz, silicon, a polymer, or the like. For example, the polymer may include polyethylene terephthalate, polyethylene naphthalate, polyether ketone, polycarbonate, polyarylate, polyether sulfone, polyimide, or any combination thereof.

A buffer layer 120 may be disposed on the base substrate 110. The buffer layer 120 may prevent or reduce penetration of impurities, humidity, or external gas from underneath of the base substrate 110, and may planarize an upper surface of the base substrate 110. For example, the buffer layer 120 may include an inorganic material such as oxide and nitride.

The active pattern AP may be disposed on the buffer layer 120. The active pattern AP may overlap the gate electrode GE.

The active pattern AP may include a semiconductor material such as amorphous silicon, polycrystalline silicon (polysilicon), and oxide semiconductor. For example, when the active pattern AP includes polysilicon, at least a portion of the active pattern AP may be doped with impurities, for example, n-type impurities or p-type impurities.

A first insulation layer 130 may be disposed on the active pattern AP. The first insulation layer 130 may include silicon oxide, silicon nitride, silicon oxynitride, silicon carbide, silicon oxycarbide, or any combination thereof. Furthermore, the first insulation layer 130 may include an insulating metal oxide such as aluminum oxide, tantalum oxide, hafnium oxide, zirconium oxide, and titanium oxide. The first insulation layer 130 may have a single-layer structure or a multiple-layer structure including silicon nitride and/or silicon oxide.

The gate electrode GE may be disposed on the first insulation layer 130. The gate electrode GE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or any alloy thereof, and may have a single-layer structure or a multiple-layer structure including different metal layers.

A second insulation layer 140 may be disposed on the gate electrode GE and the first insulation layer 130. The second insulation layer 140 may include silicon oxide, silicon nitride, silicon oxynitride, silicon carbide, silicon oxycarbide, or any combination thereof. Furthermore, the second insulation layer 140 may include an insulating metal oxide such as aluminum oxide, tantalum oxide, hafnium oxide, zirconium oxide, and titanium oxide.

A source electrode SE and a drain electrode DE may be disposed on the second insulation layer 140. The source electrode SE and the drain electrode DE may be electrically connected to the active pattern AP via respective contact holes that pass through the first insulation layer 130 and the second insulation layer 140. The source electrode SE and the drain electrode DE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or any alloy thereof, and may have a single-layer structure or a multiple-layer structure including different metal layers.

A third insulation layer 150 may be disposed on the second insulation layer 140 to cover the source electrode SE and the drain electrode DE. The third insulation layer 150 may include an inorganic insulation material, an organic insulation material, or any combination thereof. Examples of the organic insulation material may include polyimide, polyamide, acrylic resin, phenol resin, and benzocyclobutene (BCB).

A source line SL and a connection electrode CE may be disposed on the third insulation layer 150. The source line SL may transfer a scan signal, a data signal, a light-emitting signal, an initialization signal, a power voltage, or the like to transistors of the pixel array. The connection electrode CE may be electrically connected to the drain electrode DE via a contact hole that passes through the third insulation layer 150. The connection electrode CE may electrically connect the drain electrode DE to a first electrode EL1 of the organic light-emitting diode. The source line SL and the connection electrode CE may include the same material as the source electrode SE and the drain electrode DE.

A fourth insulation layer 160 may be disposed on the third insulation layer 150 to cover the source line SL and the connection electrode CE. For example, the fourth insulation layer 160 may include an inorganic insulation material, an organic insulation material, or any combination thereof. For example, the organic insulation material may include polyimide, polyamide, acrylic resin, phenol resin, benzocyclobutene (BCB) or the like.

The first electrode EL1 of the organic light-emitting diode may be disposed on the fourth insulation layer 160. In an exemplary embodiment, the first electrode EL1 may function as an anode. The first electrode EL1 may be formed as a transmitting electrode or a reflecting electrode according to an emission type of the organic light-emitting diode. When the first electrode EL1 is a transmitting electrode, the first electrode EL1 may include indium tin oxide, indium zinc oxide, zinc tin oxide, indium oxide, zinc oxide, tin oxide, or the like. When the first electrode EL1 is a reflecting electrode, the first electrode EL1 may include gold (Au), silver (Ag), aluminum (Al), copper (Cu), nickel (Ni), platinum (Pt), magnesium (Mg), chromium (Cr), tungsten (W), molybdenum (Mo), titanium (Ti), or any combination thereof, and may have a stack structure further including a material that may be used for the transmitting electrode.

A pixel-defining layer PDL may be disposed on the fourth insulation layer 160. The pixel-defining layer PDL may include an opening that exposes at least a portion of the first electrode EL1. The pixel-defining layer PDL may include an organic insulation material.

An organic light-emitting layer OL may be disposed on the first electrode EL1. In an exemplary embodiment, the organic light-emitting layer OL may be disposed in the opening of the pixel-defining layer PDL. In another exemplary embodiment, the organic light-emitting layer OL may extend over an upper surface of the pixel-defining layer PDL, or may continuously extend across a plurality of pixels PX in the pixel area 30.

The organic light-emitting layer OL may include at least a light-emitting layer, and may further include at least one of a hole injection layer (HIL), a hole transporting layer (HTL), an electron transporting layer (ETL), and an electron injection layer (EIL). The organic light-emitting layer OL may include a low molecular weight organic compound or a high molecular weight organic compound.

In an exemplary embodiment, the organic light-emitting layer OL may emit a red light, a green light, or a blue light. In another exemplary embodiment, the organic light-emitting layer OL may emit a white light. The organic light-emitting layer OL emitting a white light may have a multiple-layer structure including a red light-emitting layer, a green light -emitting layer, and a blue light -emitting layer, or a single-layer structure including a mixture of a red light -emitting material, a green light-emitting material, and a blue light-emitting material.

A second electrode EL2 of the organic light-emitting diode may be disposed on the organic light-emitting layer OL. The second electrode EL2 may continuously extend across a plurality of pixels PX on the pixel area 30.

In an exemplary embodiment, the second electrode EL2 may function as a cathode. The second electrode EL2 may be formed as a transmitting electrode or a reflecting electrode according to an emission type of the organic light-emitting diode. For example, when the second electrode EL2 is a transmitting electrode, the second electrode may include lithium (Li), calcium (Ca), lithium fluoride (LiF), aluminum (Al), magnesium (Mg), or any combination thereof, and the organic light-emitting display device 100 may further include a sub electrode or a bus electrode line that includes indium tin oxide, indium zinc oxide, zinc tin oxide, indium oxide, zinc oxide, tin oxide, or the like.

A thin film encapsulation layer may be disposed on the second electrode EL2. The thin film encapsulation layer may have a stack structure of an inorganic layer 174 and an organic layer 172. In this case, the organic layer 172 may be disposed on the second electrode EL2, and the inorganic layer 174 may be disposed on the organic layer 172. However, exemplary embodiment are not limited thereto. For example, the thin film encapsulation layer may have a stack structure including one or more of a first inorganic layer, an organic layer and a second inorganic layer, a stack structure including a first inorganic layer, a first organic layer, a second inorganic layer, a second organic layer, and a third inorganic layer.

In an exemplary embodiment, the organic layer 172 may include a cured resin such as poly(meth)acrylate. For example, the cured resin may be formed by cross-linking reaction of monomers.

In an exemplary embodiment, the inorganic layer 174 may include an inorganic material such as silicon oxide, silicon nitride, silicon carbide, aluminum oxide, tantalum oxide, hafnium oxide, zirconium oxide, and titanium oxide.

Although not illustrated, a capping layer and a blocking layer may be disposed between the second electrode EL2 and the thin film encapsulation layer.

The capping layer may protect the organic light-emitting diode and may promote the light generated by the organic light-emitting diode to exit outwardly.

In an exemplary embodiment, the capping layer 184 may include an inorganic material or an organic material. Examples of the inorganic material may include zinc oxide, tantalum oxide, zirconium oxide, and titanium oxide. Examples of the organic material may include poly(3,4-ethylenedioxythiophene), PEDOT), 4,4'-bis[N-(3-methylphenyl)-N-phenylamino]biphenyl(TPD), 4,4',4"-tris[(3-methylphenyl)phenylamino]triphenylamine (m-MTDATA), 1,3,5-tris[N,N-bis(2-methylphenyl)-amino]-benzene (o-MTDAB), and 1,3,5-tris[N,N-bis(3-methylphenyl)-amino]-benzene (m-MTDAB).

The blocking layer may be disposed on the capping layer. The blocking layer may prevent a damage to the organic light-emitting diode by plasma or the like in later processes. The blocking layer may include lithium fluoride, magnesium fluoride, calcium fluoride, or the like.

A touch screen structure may be disposed on the thin film encapsulation layer. The touch screen structure may include a sensing electrode TE. In an exemplary embodiment, the touch screen structure may include any combination of the sensing electrode TE and a sub-sensing electrode. The touch screen structure may be of a mutual capacitance type. For example, an external device may provide touch sensing signals to the sensing electrode TE and the sub-sensing electrode. When a user contacts an area corresponding to the sensing electrode TE, capacitance between the sensing electrode TE and the sub-sensing electrode may change. The external device may sense the capacitance variance caused by the user's touch thereby detecting a touch position.

The fan-out wiring FL, a first power voltage wiring VSS, a second power voltage wiring VDD, a first dam structure DM1 and a second dam structure DM2 may be disposed in the peripheral area 40. The dam structures DM1 and DM2 may extend along the peripheral area 40, for example, in a second direction D2.

In the peripheral area 40, the buffer layer 120 may be disposed on the base substrate 110, and the first insulation layer 130 may be disposed on the buffer layer 120. The buffer layer 120 and the first insulation layer 130 may extend from the pixel area 30 to the peripheral area 40. The fan-out wiring FL may be disposed on the first insulation layer 130.

The fan-out wiring FL may be formed in the same layer as the gate electrode GE. Thus, the fan-out wiring FL and the gate electrode GE may be included in a gate metal pattern.

The fan-out wiring FL may have a shape extending in a direction, and a plurality of lines may be spaced apart from each other as illustrated in FIGS. 3 and 4.

The second insulation layer 140 covers the fan-out wiring FL.

The first lower power voltage line VSS1 and the second lower power voltage line VDD1 may be disposed on the second insulation layer 140.

The first lower power voltage line VSS1 and the second lower power voltage line VDD1 may be formed in the same layer as the source electrode SE and the drain electrode DE, and may be spaced apart from each other in a horizontal direction in a cross-sectional view. The second lower power voltage line VDD1 may be disposed between the first lower power voltage line VSS1 and the pixel area 30.

The first lower power voltage line VSS1 and the second lower power voltage line VDD1 may overlap the fan-out wiring FL.

The third insulation layer 150 may partially cover the first lower power voltage line VSS1 and the second lower power voltage line VDD1.

The first upper power voltage line VSS2 and the second upper power voltage line VDD2 may be disposed on the third insulation layer 150. The first upper power voltage line VSS2 contacts the first lower power voltage line VSS1, and the second upper power voltage line VDD2 contacts the second lower power voltage line VDD1.

The first upper power voltage line VSS2 and the second upper power voltage line VDD2 may be formed in the same layer as the source line SL and the connection electrode CE, and may be spaced apart from each other in a horizontal direction. Furthermore, the first upper power voltage line VSS2 may overlap a portion of the second lower power voltage line VDD1. Thus, the first upper power voltage line VSS2 may cover a gap between the first lower power voltage line VSS1 and the second lower power voltage line VDD1 in a plan view as illustrated in FIG. 4.

The fourth insulation layer 160 may cover at least a portion of the first upper power voltage line VSS2 and the second upper power voltage line VDD2. In an exemplary embodiment, the fourth insulation layer 160 may extend from the pixel area 30 to the peripheral area 40 to cover at least an edge of the first upper power voltage line VSS2.

The second electrode EL2 may extend from the pixel area 30 and may contact the first upper power voltage line VSS2 in the peripheral area 40. Thus, a first power voltage provided by the first power voltage wiring VSS may be transmitted to the second electrode EL2.

The second power voltage wiring VDD may provide a second power voltage to the pixel PX in the pixel area 30. For example, a transistor of the pixel PX may generate a driving current by using the second power voltage. The driving current may be provided to the organic light-emitting diode of the pixel PX.

The first dam structure DM1 may be disposed on the first upper power voltage line VSS2. The first dam structure DM1 may be disposed between the second dam structure DM2 and the pixel area 30.

The first dam structure DM1 may include an upper pattern DM1b and a lower pattern DM1a. The upper pattern DM1b may be formed in the same layer as the pixel-defining layer PDL. The lower pattern DM1a may be formed in the same layer as the fourth insulation layer 160.

The second dam structure DM2 may include an upper pattern DM2b and a lower pattern DM2a. The upper pattern DM2b may be formed in the same layer as the pixel-defining layer PDL. The lower pattern DM2a may be formed in the same layer as the fourth insulation layer 160.

The first dam structure DM1 and the second dam structure DM2 may prevent monomers from overflowing in the process of forming the organic layer 172 of the thin film encapsulation layer.

In exemplary embodiments, the number of the dam structures is not limited to two, and one or at least three of dam structures may be disposed as desired. Furthermore, the dam structures may be omitted.

The thin film encapsulation layer may extend from the pixel area 30 to the peripheral area 40. For example, the organic layer 172 may extend to cover at least a portion of the first upper power voltage line VSS2. The inorganic layer 174 may extend to cover the second dam structure DM2.

The touch screen structure may extend over the thin film encapsulation layer so that the sensing electrode TE may be further disposed in the peripheral area 40.

In an exemplary embodiment, the first power voltage wiring VSS and the second power voltage wiring VDD respectively include a lower power voltage line and an upper power voltage line that are formed in different layers and disposed on different planes, respectively. Thus, the width of the first power voltage wiring VSS and the second power voltage wiring VDD may be reduced compared to a single-layered power voltage wiring structure to exhibit similar conductivity. Thus, a size (e.g., a width) of the peripheral area 40 may be reduced, and a size of a non-display area (e.g., a bezel area) in the organic light-emitting display device 100 may be reduced.

In an exemplary embodiment, the first upper power voltage line VSS2 expands toward the pixel area 30, and the second lower power voltage line VDD1 expands toward the first power voltage wiring VSS thereby forming an asymmetrical structure. Thus, a boundary of the second electrode EL2 of the organic light-emitting diode may be shifted toward the pixel area 30, Accordingly, a size of the second electrode EL2 in the peripheral area 40 may be reduced, and a size of the non-display area in the organic light-emitting display device may be reduced.

In an exemplary embodiment, the first upper power voltage line VSS2 covers a gap between the first lower power voltage line VSS1 and the second lower power voltage line VDD1 in a plan view. Thus, a noise generated by interference between the fan-out wiring FL and the touch screen structure may be reduced or prevented.

In an exemplary embodiment, the first power voltage wiring VSS and the second power voltage wiring VDD are disposed in the peripheral area 40 between the pixel area 30 and the bending area 50. However, exemplary embodiments are not limited thereto, and the asymmetrical structure may be applied to various areas where the first power voltage wiring VSS and the second power voltage wiring VDD are disposed.

FIGS. 6 to 12 are cross-sectional views illustrating an example process of manufacturing the organic light-emitting display device 100 illustrated in FIGS. 1 to 5 according to an exemplary embodiment. FIGS. 6 to 12 show cross-sections taken along the line I-I' of FIGS. 3 and 4.

Figure 6:
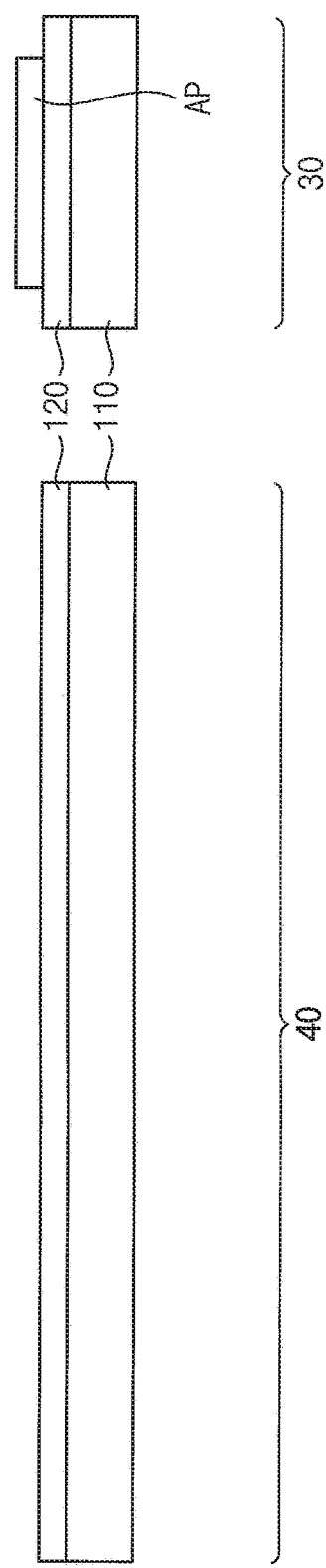
FIGS. 6 to 12 are cross-sectional views illustrating an example process of manufacturing the organic light-emitting display device illustrated in FIGS. 1 to 5 according to an exemplary embodiment.

Referring to FIG. 6, the buffer layer 120 is formed on the base substrate 110. A semiconductor layer is formed on the buffer layer 120, and patterned to form the active pattern AP in the pixel area 30. The active pattern AP may include polysilicon. For example, an amorphous silicon layer is formed on the buffer layer 120, and a laser may be irradiated onto the amorphous silicon layer to form a polysilicon layer. The polysilicon layer may be further polished as desired.

Figure 7:
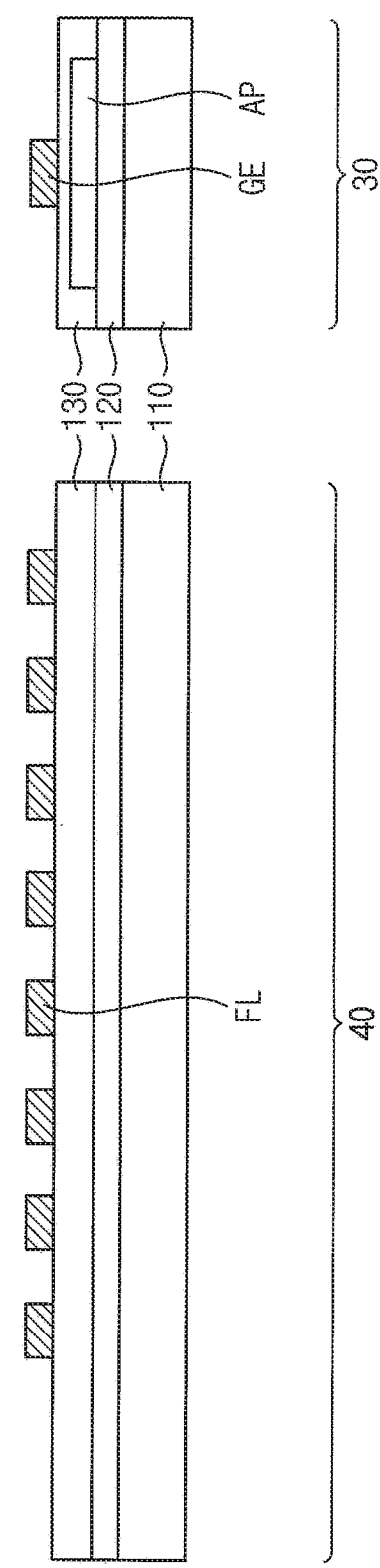

Referring to FIG. 7, the first insulation layer 130 is formed to cover the active pattern AP. A gate metal pattern is formed on the first insulation layer 130. In this case, the first insulation layer 130 may be a gate insulation layer.

The gate metal pattern may include the gate electrode GE disposed in the pixel area 30, and the fan-out wiring FL disposed in the peripheral area 40. The gate electrode GE may overlap the active pattern AP. The fan-out wiring FL may include a plurality of lines extending in a direction and spaced apart from each other. The gate metal pattern may have a single-layer structure or a multiple-layer structure. In an exemplary embodiment, the gate metal pattern may include molybdenum.

In another exemplary embodiment, at least one additional gate metal pattern may be added in a different layer for forming a double-gate structure and/or a capacitor electrode, and at least one gate insulation layer may be added to cover the additional gate metal pattern.

Figure 8:
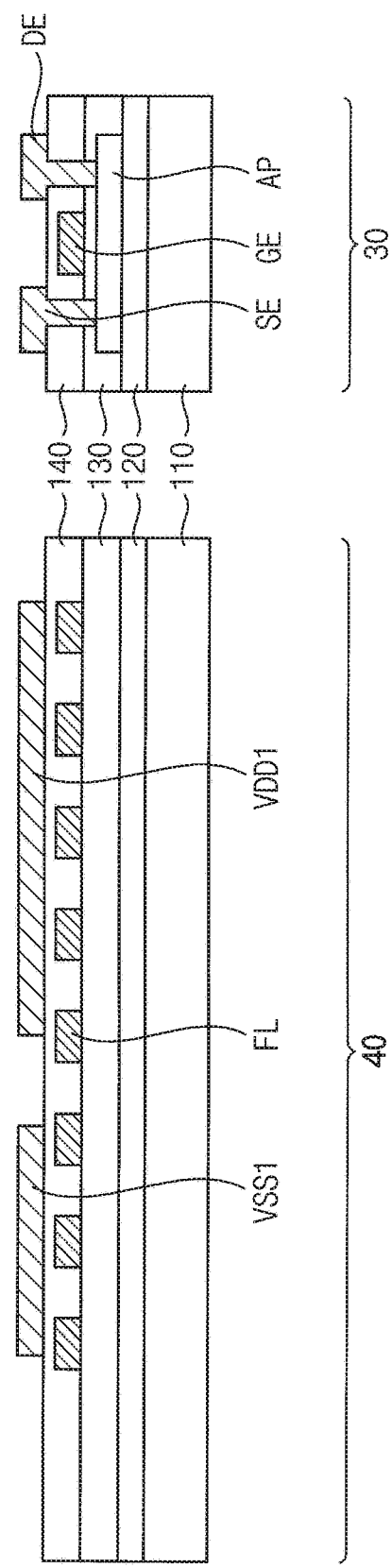

Referring to FIG. 8, the second insulation layer 140 is formed to cover the gate metal pattern. Thereafter, a contact hole is formed through the second insulation layer 140 and the first insulation layer 130 to expose a portion of the active pattern AP. Thereafter, a first source metal pattern is formed on the second insulation layer 140.

The first source metal pattern may include the source electrode SE, the drain electrode DE, the first lower power voltage line VSS1, and the second lower power voltage line VDD1. The source electrode SE and the drain electrode DE are disposed in the pixel area 30. The source electrode SE and the drain electrode DE are electrically connected to the active pattern AP via respective contact holes that pass through the first insulation layer 130 and the second insulation layer 140, and are spaced apart from each other. The first lower power voltage line VSS1 and the second lower power voltage line VDD1 are disposed in the peripheral area 40, and spaced apart from each other.

At least one of the first lower power voltage line VSS1 and the second lower power voltage line VDD1 may overlap the fan-out wiring FL. In an exemplary embodiment, both of the first lower power voltage line VSS1 and the second lower power voltage line VDD1 may overlap the fan-out wiring FL. Furthermore, a gap between the first lower power voltage line VSS1 and the second lower power voltage line VDD1 may overlap the fan-out wiring FL in a plan view.

The first source metal pattern may have a single-layer structure or a multiple-layer structure. In an exemplary embodiment, the first source metal pattern may have a multiple-layer structure including a titanium layer and an aluminum layer.

Figure 9:
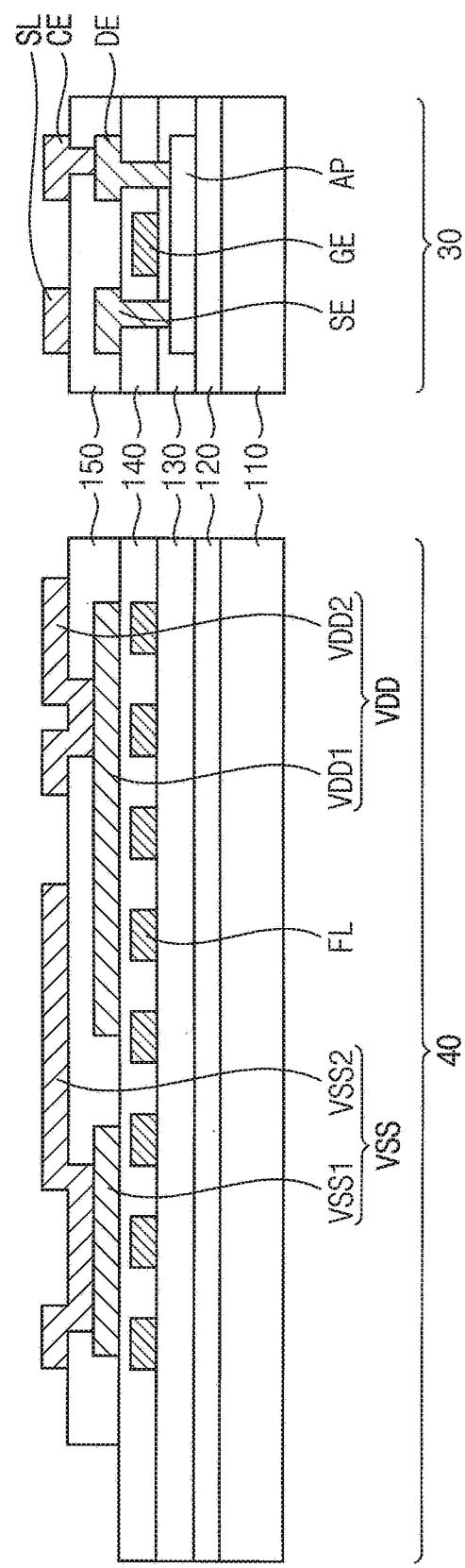

Referring to FIG. 9, the third insulation layer 150 is formed to cover the first source metal pattern. The third insulation layer 150 may include contact holes or openings that expose the drain electrode DE, the first lower power voltage line VSS1, and the second lower power voltage line VDD1. Thereafter, a second source metal pattern is formed on the third insulation layer 150. The third insulation layer 150 may also be referred as a first via insulation layer.

The second source metal pattern may include the connection electrode CE that contacts the drain electrode DE, the source line SL, the first upper power voltage line VSS2 that contacts the first lower power voltage line VSS1, and the second upper power voltage line VDD2 that contacts the second lower power voltage line VDD1.

A width of the first upper power voltage line VSS2 may be greater than a width of the first lower power voltage line VSS1. For example, the first upper power voltage line VSS2 may have a shape extending toward the pixel area 30 in a cross-sectional view. A width of the second lower power voltage line VDD1 may be greater than a width of the second upper power voltage line VDD2. For example, the second lower power voltage line VDD1 may have a shape extending toward the first lower power voltage line VSS1 in a cross-sectional view. In an exemplary embodiment, the first upper power voltage line VSS2 may overlap at least a portion of the second lower power voltage line VDD1 in a plan view. The first upper power voltage line VSS2 may cover a gap between the first lower power voltage line VSS1 and the second lower power voltage line VDD1 in a plan view.

Figure 10:
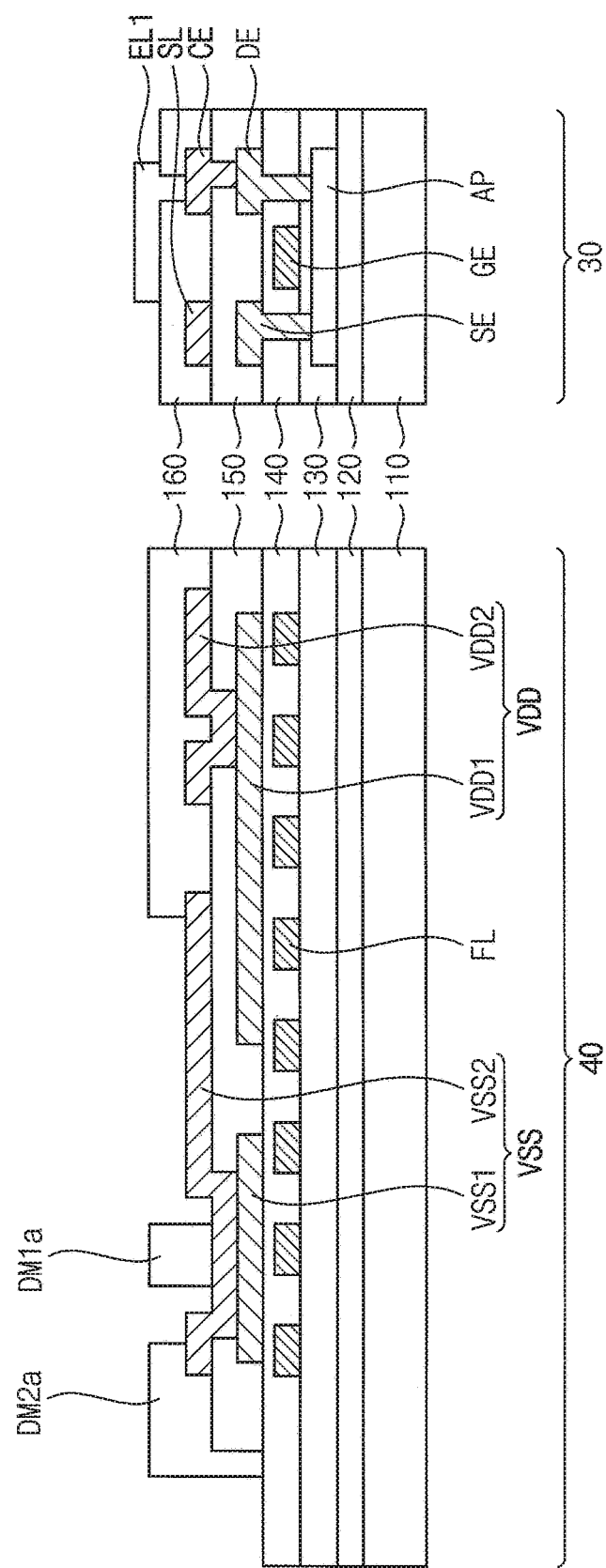

Referring to FIG. 10, the fourth insulation layer 160 is formed to cover the second source metal pattern. The fourth insulation layer 160 may also be referred as a second via insulation layer. The fourth insulation layer 160 may include a contact hole exposing the connection electrode CE. The fourth insulation layer 160 may extend from the pixel area 30 to the peripheral area 40 to cover the second upper power voltage line VDD2. The fourth insulation layer 160 may include one or more dam structures. For example, the lower pattern DM1a of the first dam structure DM1 may be formed on the first upper power voltage line VSS2, and the lower pattern DM2a of the second dam structure DM2 may be formed to be spaced apart from the first dam structure DM1.

Thereafter, the first electrode EL1 of the organic light-emitting diode is formed on the fourth insulation layer 160. The first electrode EL1 may contact the connection electrode CE.

Figure 11:
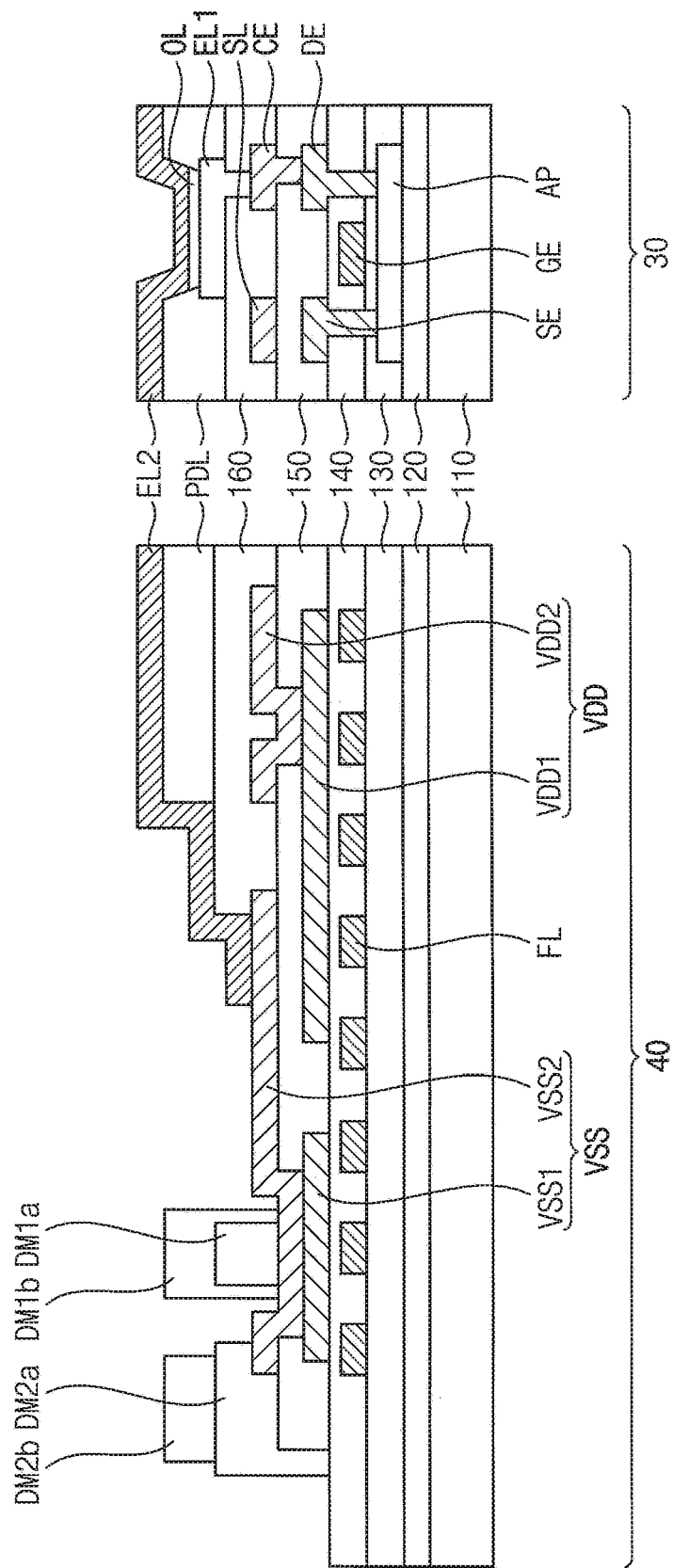

Referring to FIG. 11, the pixel-defining layer PDL is formed on the fourth insulation layer 160. The pixel-defining layer PDL includes an opening that exposes at least a portion of the first electrode EL1. Another pattern of the dam structures DM1 and DM2 may be formed in the pixel-defining layer PDL. For example, the upper pattern DM1b of the first dam structure DM1 may be formed on the lower pattern DM1a of the first dam structure DM1, and an upper pattern DM2b of the second dam structure DM2 may be formed on the lower pattern DM2a of the second dam structure DM2.

The organic light-emitting layer OL may be formed on the first electrode EL1. The second electrode EL2 may be formed on the organic light-emitting layer OL and the pixel-defining layer PDL. The second electrode EL2 may extend from the pixel area 30 to the peripheral area 40 to connect to the first upper power voltage line VSS2.

Although not illustrated, a capping layer, a blocking layer, or the like may be further formed on the second electrode EL2.

Figure 12:
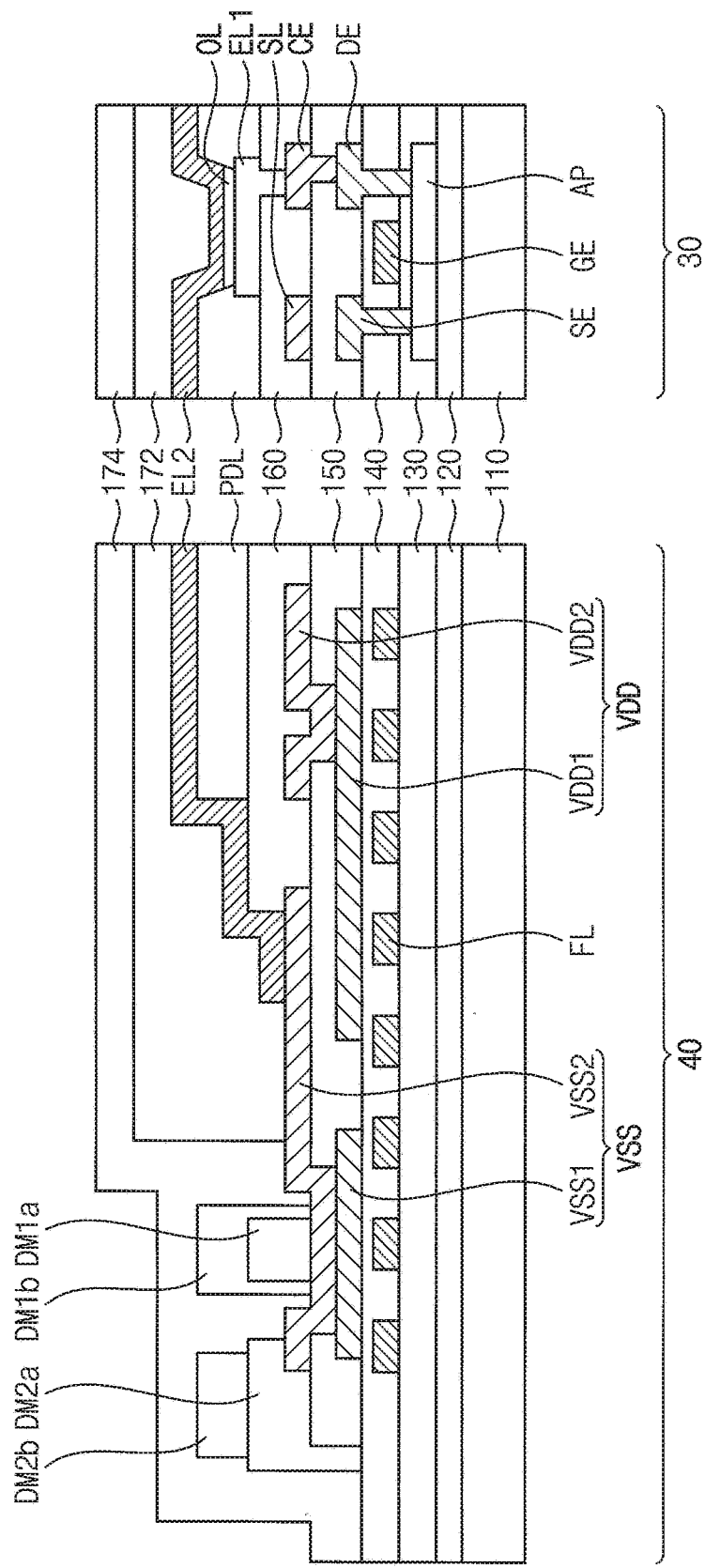

Referring to FIG. 12, the thin film encapsulation layer is formed in the pixel area 30 and the peripheral area 40. The thin film encapsulation layer may include the organic layer 172 and the inorganic layer 174.

Thereafter, as illustrated in FIG. 5, a touch screen structure including the sensing electrode TE may be formed on the thin film encapsulation layer.

Figure 13:
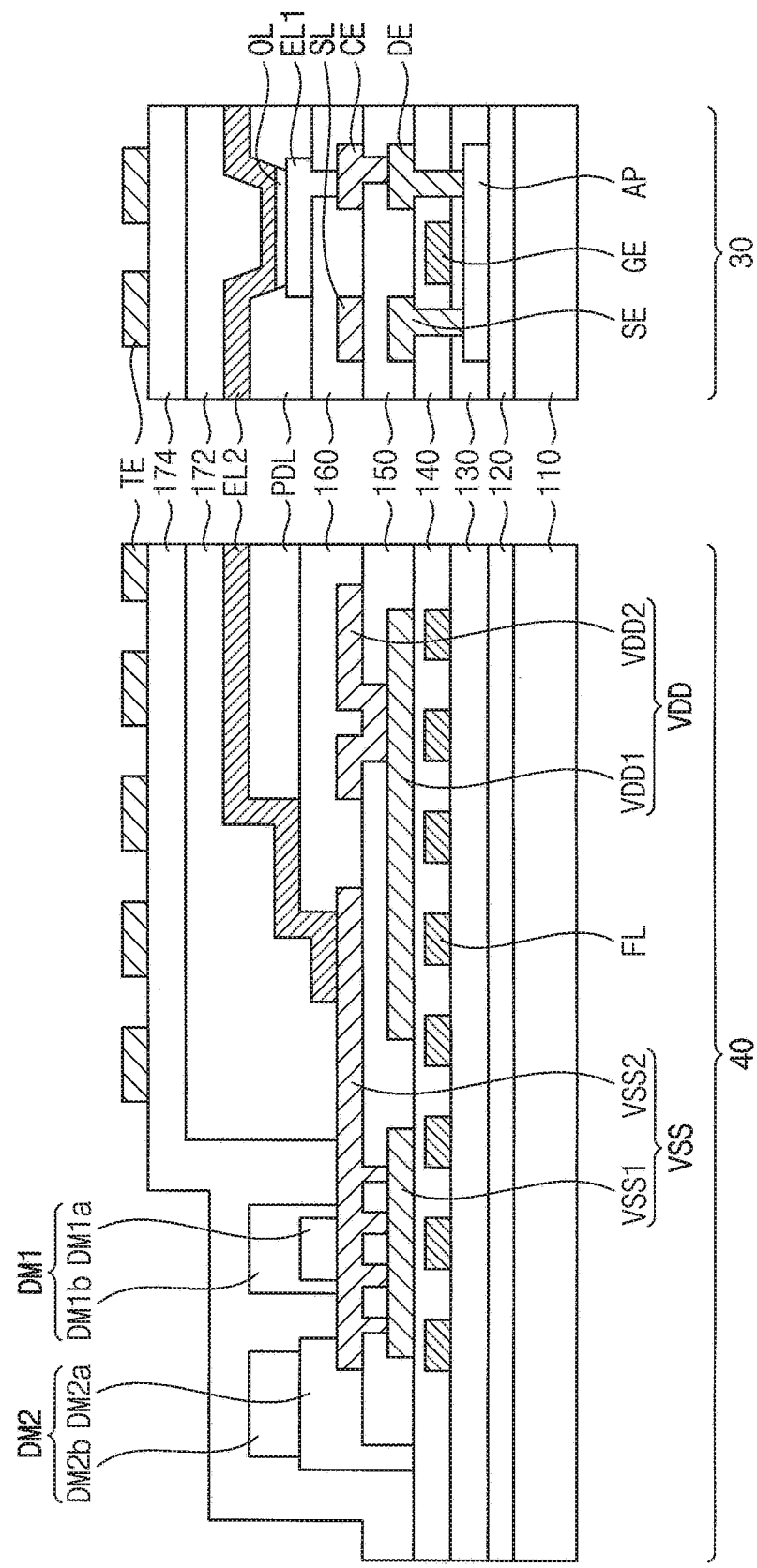
FIG. 13 is a cross-sectional view illustrating an organic light-emitting display device according to an exemplary embodiment.

FIG. 13 is a cross-sectional view illustrating an organic light-emitting display device according to an exemplary embodiment. FIG. 13 shows a cross-section taken along the line I-I' of FIGS. 3 and 4.

Referring to FIG. 13, a pixel PX disposed in the pixel area 30 includes a driving transistor that is disposed on the base substrate 110, an organic light-emitting diode that is electrically connected to the driving transistor, and a thin film encapsulation layer that covers the organic light-emitting diode.

The fan-out wiring FL, the first power voltage wiring VSS, the second power voltage wiring VDD, the first dam structure DM1, and the second dam structure DM2 may be disposed in the peripheral area 40 that surrounds the pixel area 30.

The organic light-emitting display device illustrated in FIG. 13 may have substantially same configuration as the organic light-emitting display device 100 illustrated in FIG. 5 except for a connection structure of an upper layer and a lower layer of the power voltage wirings VSS and VDD. Thus, any duplicated explanation may be omitted.

Referring to FIG. 13, the first power voltage wiring VSS includes the first lower power voltage line VSS1 and the first upper power voltage line VSS2. The first upper power voltage line VSS2 is disposed on the first lower power voltage line VSS1. The first upper power voltage line VSS2 may pass through a plurality of contact holes formed in the third insulation layer 150 to connect to the first lower power voltage line VSS1.

The second power voltage wiring VDD includes the second lower power voltage line VDD1 and the second upper power voltage line VDD2. The second upper power voltage line VDD2 may pass through a contact hole formed in the third insulation layer 150 to connect to the second lower power voltage line VDD1. In another example embodiment, the second upper power voltage line VDD2 may be electrically connected to the second lower power voltage line VDD 1 via a plurality of contact holes formed in the third insulation layer 150.

When the upper layer and the lower layer does not form a continuous contact interface but are connected through one or more contact holes, contamination or a damage to a pixel circuit due to static electricity may be reduced or prevented.

Figure 14:
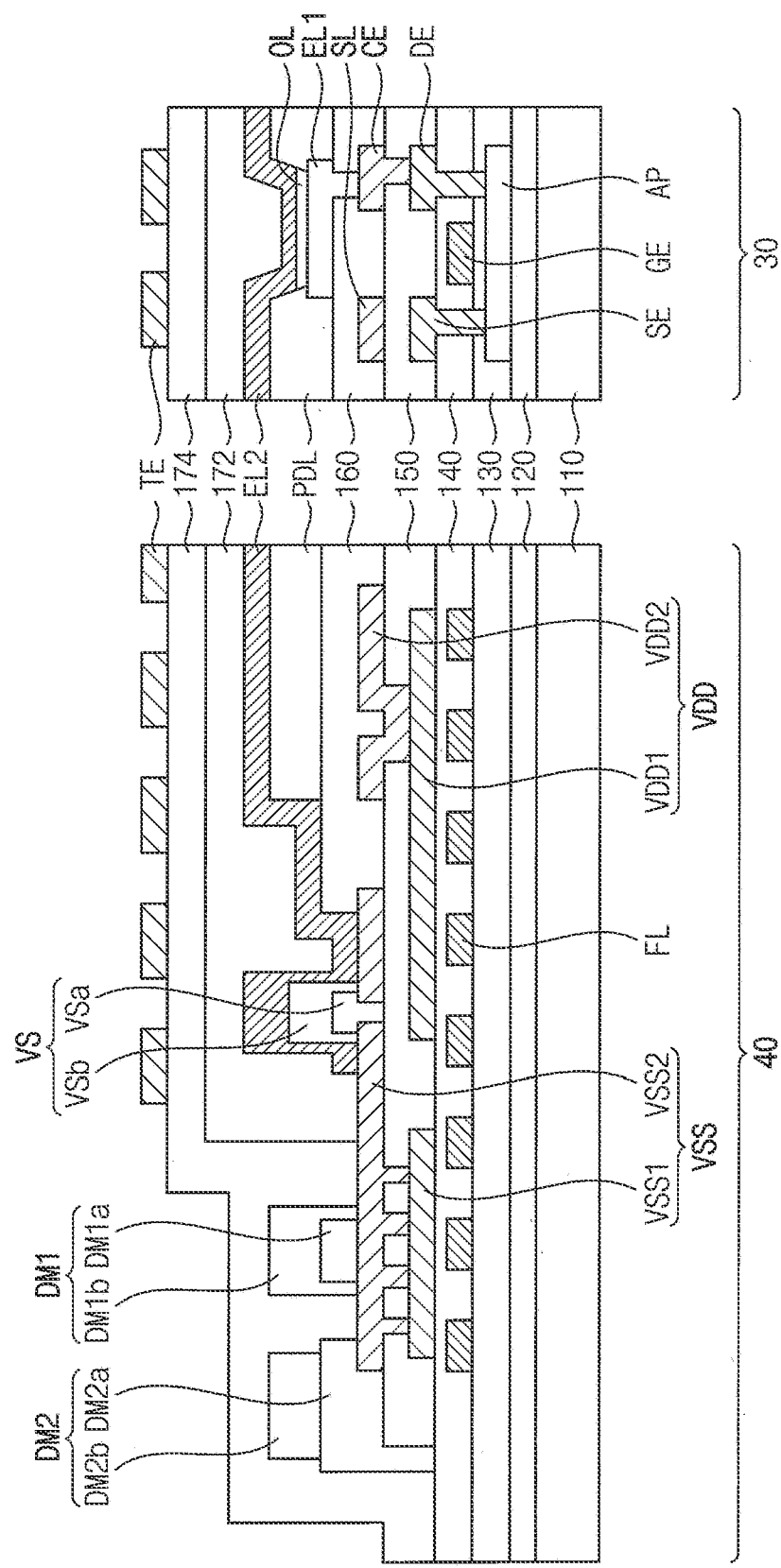
FIG. 14 is a cross-sectional view illustrating an organic light-emitting display device according to an exemplary embodiment.

FIG. 14 is a cross-sectional view illustrating an organic light-emitting display device according to an exemplary embodiment. FIG. 14 shows a cross-section taken along the line I-I' of FIGS. 3 and 4.

Referring to FIG. 14, a pixel PX disposed in the pixel area 30 includes a driving transistor that is disposed on the base substrate 110, an organic light-emitting diode that is electrically connected to the driving transistor, and a thin film encapsulation layer that covers the organic light-emitting diode.

The fan-out wiring FL, the first power voltage wiring VSS, the second power voltage wiring VDD, the first dam structure DM1, the second dam structure DM2 and a valley structure VS may be disposed in the peripheral area 40 that surrounds the pixel area 30.

The organic light-emitting display device illustrated in FIG. 14 may have substantially same configuration as the organic light-emitting display device illustrated in FIG. 13 except for a valley structure VS. Thus, any duplicated explanation may be omitted.

Referring to FIG. 14, the valley structure VS may be disposed between the first dam structure DM1 and the pixel area 30. For example, the valley structure VS may be disposed between the first dam structure DM1 and an end of the fourth insulation layer 160 and may be disposed on the first upper power voltage line VSS2. The valley structure VS may extend in the same direction as the dam structures DM1 and DM2.

The second electrode EL2 of the organic light-emitting diode may extend along an upper surface and a side surface of the valley structure VS. The organic layer 172 of the thin film encapsulation layer may cover the valley structure VS.

The valley structure VS may have a stack structure including a lower pattern VSa and an upper pattern VSb. The lower pattern VSa may be formed in the same layer as the fourth insulation layer 140, and the upper pattern VSb may be formed in the same layer as the pixel-defining layer PDL. The valley structure VS may increase a size of a wetting area for monomers provided thereon, and may form a valley between the valley structure VS and the end of the fourth insulation layer 160. Thus, reflowing of the monomers may be controlled in the process of forming the organic layer 172 of the thin film encapsulation layer.

As desired, a plurality of the valley structures VS may be disposed.

In an exemplary embodiment, the first upper power voltage line VSS2 may include at least one contact hole. The lower pattern VSa of the valley structure VS may be connected to the third insulation layer 150 through the contact hole.

The contact hole of the first upper power voltage line VSS2 may improve outgassing in the process of curing a via insulation layer. Furthermore, when the lower pattern VSa of the valley structure VS is connected to the third insulation layer 150, separation or lifting of the valley structure VS may be prevented in a developing process.

Exemplary embodiments of the present inventive concept may be applied to various display devices that may be used for an automobile, a vessel, an aircraft, a mobile communication device, a display device for exhibition or information delivery, a medical display device, a home appliance, or the like.

The foregoing is illustrative of exemplary embodiments and is not to be construed as limiting thereof. Although exemplary embodiments have been described, those skilled in the art will readily appreciate that many modifications are possible in the exemplary embodiments without materially departing from the novel teachings and aspects of the present inventive concept. Accordingly, such modifications are intended to be included within the scope of the present inventive concept. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the present inventive concept, as set forth in the following claims and equivalents thereof.

What is claimed is:

1. An organic light-emitting display device comprising:
   a pixel array disposed on a base substrate in a pixel area and including a light-emitting element and a transistor electrically connected to the light-emitting element;
   an insulation layer disposed between the light-emitting element and the transistor; and
   a power voltage wiring disposed in a peripheral area surrounding the pixel area and electrically connected to at least one of the light-emitting element and the transistor,
   wherein the power voltage wiring includes a first power voltage wiring and a second power voltage wiring, which are electrically insulated from each other,
   wherein the first power voltage wiring includes a first lower power voltage line and a first upper power voltage line, which are disposed in different layers and electrically connected to each other, the first upper power voltage line extending along the first lower power voltage line,
wherein the second power voltage wiring includes a second lower power voltage line and a second upper power voltage line, which are disposed in different layers and electrically connected to each other, the second upper power voltage line extending along the second lower power voltage line,
wherein at least one of the first upper voltage line and the second upper power voltage line is disposed between the insulation layer and the base substrate,
wherein the first upper power voltage line partially overlaps the second lower power voltage line with the first upper power voltage line and the second lower power voltage line extending in a first direction, and an overlapping area defined by overlapped portions of the first upper power voltage line and the second lower power voltage line extends in the first direction such that an edge of the first upper power voltage line, which overlaps the second lower power voltage line, extends in the first direction and an edge of the second lower power voltage line, which overlaps the first upper power voltage line, extends in the first direction,
wherein the light-emitting element includes a lower electrode, a light-emitting layer and an upper electrode,
wherein the upper electrode of the light-emitting elements extends into the peripheral area to overlap the second upper power voltage line and contacts the first upper power voltage line in the peripheral area.

2. The organic light-emitting display device of claim 1, wherein the second power voltage wiring is disposed between the first power voltage wiring and the pixel area.

3. The organic light-emitting display device of claim 1, wherein a width of the first upper power voltage line is greater than a width of the first lower power voltage line, and a width of the second upper power voltage line is smaller than a width of the second lower power voltage line.

4. The organic light-emitting display device of claim 1, further comprising a fan-out wiring overlapping the first power voltage wiring and the second power voltage wiring.

5. The organic light-emitting display device of claim 4, wherein the fan-out wiring is disposed under the first power voltage wiring and the second power voltage wiring.

6. The organic light-emitting display device of claim 5, wherein the fan-out wiring includes a plurality of lines spaced apart from each other, wherein at least a portion of the fan-out wiring overlaps a gap between the first lower power voltage line and the second lower power voltage line in a plan view.

7. The organic light-emitting display device of claim 4, further comprising a touch screen structure disposed in the pixel area and the peripheral area to overlap the fan-out wiring.

8. The organic light-emitting display device of claim 4, wherein the fan-out wiring is configured to transfer a data signal to the pixel array.

9. The organic light-emitting display device of claim 1, further comprising a first via insulation layer partially covering the first lower power voltage line and the second lower power voltage line.

10. The organic light-emitting display device of claim 9, wherein the first via insulation layer includes one or more contact holes, and the first upper power voltage line is connected to the first lower power voltage line through the one or more contact holes of the first via insulation layer.

11. The organic light-emitting display device of claim 9, wherein the first via insulation layer includes one or more contact holes, and the second upper power voltage line is connected to the second lower power voltage line through one or more contact holes of the first via insulation layer.

12. The organic light-emitting display device of claim 1, further comprising a thin film encapsulation layer covering the pixel array and extending to the peripheral area.

13. The organic light-emitting display device of claim 12, wherein the thin film encapsulation layer includes at least one organic layer and at least one inorganic layer.

14. The organic light-emitting display device of claim 13, further comprising at least one dam structure disposed in the peripheral area.

15. The organic light-emitting display device of claim 14, further comprising at least one valley structure disposed between the at least one dam structure and the pixel area.

16. The organic light-emitting display device of claim 15, wherein the at least one valley structure is disposed on the first upper power voltage line and is connected to a first via insulation layer that is disposed under the first upper power voltage line through a contact hole of the first upper power voltage line.

* * * * *